US006414548B1

(12) United States Patent
Weber

(10) Patent No.: US 6,414,548 B1
(45) Date of Patent: Jul. 2, 2002

(54) DIFFERENTIAL AMPLIFIER HAVING TWO CHANNELS

(75) Inventor: Stephan Weber, München (DE)

(73) Assignee: Infineon Technologies AG, Munich (DE)

( * ) Notice: Subject to any disclaimer, the term of this patent is extended or adjusted under 35 U.S.C. 154(b) by 64 days.

(21) Appl. No.: 09/607,320

(22) Filed: Jun. 30, 2000

(30) Foreign Application Priority Data

Jun. 30, 1999 (DE) .......................................... 199 30 163

(51) Int. Cl.[7] .................................................. H03F 3/45
(52) U.S. Cl. ...................................................... 330/260
(58) Field of Search ................................ 330/252, 253, 330/260

(56) References Cited

U.S. PATENT DOCUMENTS 5,392,002 A * 2/1995 Delano ........................ 330/252
5,963,092 A * 10/1999 van Zalinge ................. 330/252
6,118,340 A * 9/2000 Koen ........................... 330/253
6,278,321 B1 * 8/2001 Franck ..................... 330/260 X

FOREIGN PATENT DOCUMENTS

EP     0 637 128 A1    2/1995
EP     0 910 164 A1    4/1999

* cited by examiner

Primary Examiner—Steven J. Mottola
(74) Attorney, Agent, or Firm—Laurence A. Greenberg; Werner H. Stemer; Gregory L. Mayback

(57) ABSTRACT

A differential amplifier includes two channels. Each channel has an input, an output, an emitter transistor, and a first current source. The channels are connected to one another via a resistor. In at least one of the two channels, a potential-shifting device is assigned to the first current source. A voltage-controlled, second current source is provided for linearization purposes. A third current source forms the output of the differential amplifier.

19 Claims, 5 Drawing Sheets

Prior Art    FIG 1
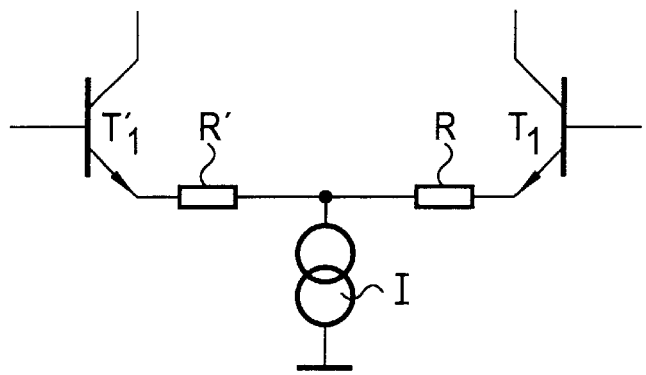
Prior Art    FIG 2
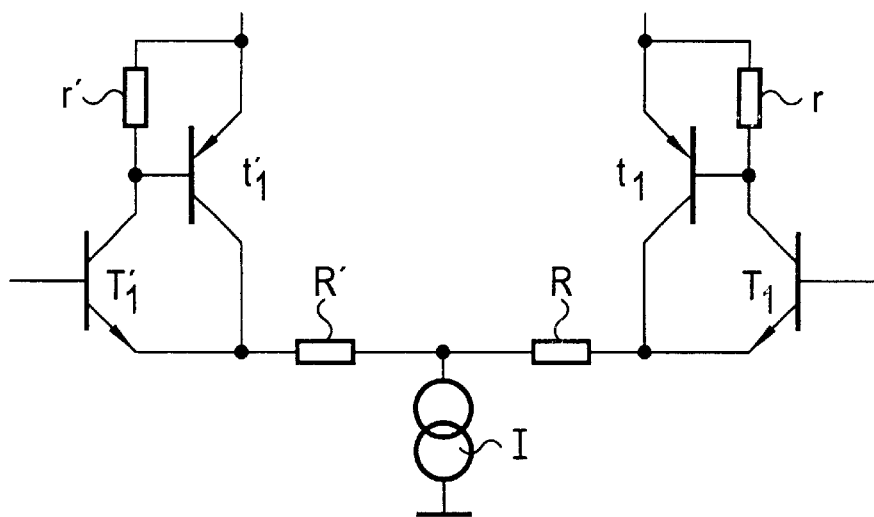
Prior Art    FIG 3
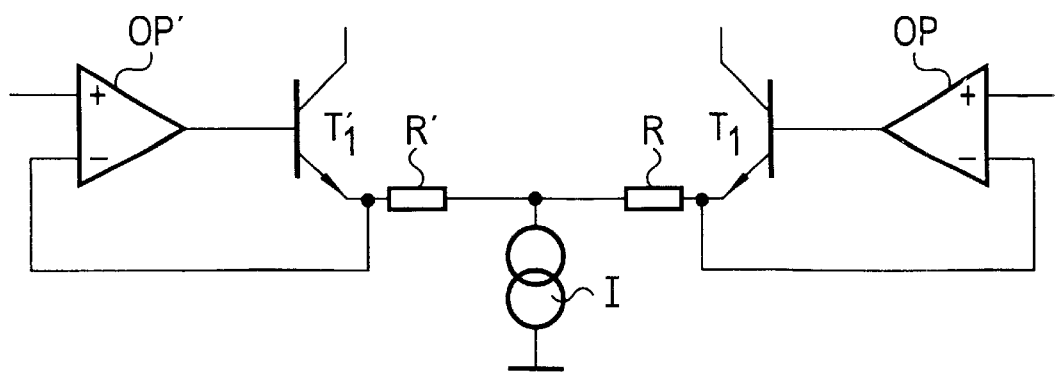

DIFFERENTIAL AMPLIFIER HAVING TWO CHANNELS

BACKGROUND OF THE INVENTION

Field of the Invention

The invention relates to a differential amplifier having two channels, each channel having an input, an output and a transistor.

Differential amplifiers of this type are disclosed, for example, in the textbook "Halbleiter-Schaltungstechnik" ["Semiconductor Circuit Technology"], pages 361 ff, Tietze/Schenk, 11th Edition, Springer Publishers. These conventional differential amplifiers are symmetrical amplifiers having two inputs and two outputs. The differential amplifier is formed of two common emitter circuits or two common source circuits, if field-effect transistors are being used, and the differential amplifier is used to amplify a differential voltage between the two inputs. The differential amplifier is generally operated using a positive and a negative supply voltage, which are preferably in symmetrical form. If only one positive or only one negative supply voltage is available, ground may be used as the second supply voltage.

Such differential amplifiers are frequently used as voltage-controlled current sources. Important criteria for these differential amplifiers are high linearity, that is to say a constant conversion factor between the input voltages and the output voltages or output currents, a high bandwidth and low noise. If high linearity is achieved only at the expense of a high voltage requirement and a low transmission factor, this may have disadvantageous effects, particularly with low operating voltages, such as in mobile radio appliances, which are operated using rechargeable batteries.

In order to linearize differential amplifiers, emitter resistors may be used for example, but these impair the noise properties and a high level of negative feedback is required for high linearity, so that the necessary input voltage becomes correspondingly higher and higher. This is particularly disadvantageous if the operating voltage available is low. An operational amplifier is therefore frequently also used in order to linearize the amplifier. However, this results in additional costs and offset voltages. Also, a pnp-npn Darlington transistor may be used, but this is unfavorable in the manufacturing process for large-scale production, since pnp transistors have, in standard processes, disadvantageous properties with regard to bandwidth, current-gain etc. Modern manufacturing processes allow high-quality pnp transistors to be produced, albeit at the expense of additional process steps in the manufacturing process, and hence at the expense of additional manufacturing costs.

SUMMARY OF THE INVENTION

It is accordingly an object of the invention to provide a differential amplifier which overcomes the above-mentioned disadvantages of the heretofore-known amplifiers of this general type and which requires only low operating voltages, is additionally inexpensive to manufacture and which presents no problems with regard to mass production as an integrated circuit.

With the foregoing and other objects in view there is provided, in accordance with the invention, a differential is amplifier, including:

a first channel and a second channel;

each of the first and second channels having an input, an output and a terminal to be connected to a supply voltage, a transistor with a first controlled path, a first current source connected to the first controlled path, the first controlled path being connected to the terminal via the first current source, a second current source having a second controlled path connected in series with the first controlled path, the second current source being a voltage controlled current source, a third current source connected to the output, the third current source being a controlled current source, a potential-shifting device connected to the first current source, the second and third current sources being controllable via the potential-shifting device; and a resistor connected to the first controlled path in the first channel and to the first controlled path in the second channel for connecting the first channel to the second channel.

In other words, the inventor proposes to modify the conventional type of differential amplifier including two channels, each having an input, an output, an emitter transistor and a first current source, the channels being connected to one another via a resistor, by assigning a potential-shifting device or level shifter to the current source in at least one channel, and by providing a voltage-controlled, second current source for linearization purposes, the output of the differential amplifier being formed by a further, third controlled current source. The further, third current source can then supply a current which is proportional to the current from the second current source, and, in this way, ensures that the linearity of the differential amplifier according to the invention is significantly improved in the context of the circuit configuration.

The differential amplifier may preferably be configured such that at least one of the two first current sources is in the form of a constant current source.

In addition, it is particularly advantageous if the two channels of the differential amplifier are of a symmetrical configuration.

Advantageously, a diode or a transistor connected as a diode may also be used as the potential-shifting device. The result of this is that the circuit is kept simple and retains a high bandwidth.

In accordance with another feature of the invention, the potential-shifting device is formed by a resistor, a voltage source or a Z-diode instead of the transistor or the diode.

In accordance with yet another feature of the invention, at least one of the two voltage-controlled, second current sources is formed of a transistor.

In accordance with a further feature of the invention, at least one linearization device may also be in the form of a transistor or a voltage-controlled current source, for example the second current source.

In accordance with yet a further feature of the invention, the at least one transistor of the linearization device and the at least one transistor of the current source in at least one respective channel are connected by their respective bases.

With regard to mass production, it is particularly advantageous if at least one transistor of the differential amplifier, but preferably all the transistors of the differential amplifier, is/are in the form of (an) npn transistor(s). In this way, high frequencies can also be processed using the circuit.

Alternatively, it is also possible for the transistor or transistors of the differential amplifier to be in the form of pnp transistors, however disadvantages with regard to mass production and amplifier properties have to be accepted.

Another possibility for the configuration of the circuit configuration according to the invention is for at least one transistor of the differential amplifier, preferably all the transistors of the differential amplifier, to be (an) FET transistor(s).

The controlled path of an npn or pnp transistor is its collector/emitter path. The control connection of the bipolar transistor is its base electrode. The controlled path of a MOS field-effect transistor is its drain/source path. The control connection of the MOS field-effect transistor is its gate electrode.

It is noted that the features of the invention which are mentioned above and are yet to be explained below can be used not only in the particular combination indicated, but also in other combinations or alone, without departing from the scope of the invention.

Other features which are considered as characteristic for the invention are set forth in the appended claims.

Although the invention is illustrated and described herein as embodied in a differential amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a conventional differential amplifier with linearization by emitter resistors;

FIG. 2 is a circuit diagram of a conventional differential amplifier with improved linearization by a further transistor;

FIG. 3 is a circuit diagram of a conventional differential amplifier with improved linearization by an operational amplifier;

DESCRIPTION OF THE PREFERRED EMBODIMENTS

Referring now to the figures of the drawings in detail and first, particularly, to FIG. 1 thereof, there is shown a simple conventional linearized differential amplifier which is formed of the two transistors $T'_1$ and $T_1$, which are connected to a current source I via two resistors R' and R. This embodiment presents poor noise properties and inadequate linearity. Alternatively, also two current sources and one resistor may be used.

A further conventional circuit configuration for a differential amplifier with improved linearization is shown in FIG. 2. FIG. 2 shows a differential amplifier having two common-emitter transistors $T'_1$ and $T_1$ connected to the current source I via the resistors R' and R. The circuit configuration shown in FIG. 2 further includes transistors $t_1$, $t'_1$ and resistors r, r' in order to form a Darlington-type configuration.

This type of circuit configuration impairs the noise properties, however, and a high level of negative feedback is required, so that the input voltage range becomes relatively large. This high input voltage range is particularly disadvantageous with rechargeable battery operation, in which only low operating voltages are available.

A further, relatively costly conventional circuit configuration for a differential amplifier is shown in FIG. 3. In this case, a high level of linearization is achieved by the use of two operational amplifiers OP' and OP. Although such a circuit configuration has a high level of linearity, it usually has poor dynamic properties, because operational amplifiers are generally slower than individual transistors.

In summary, therefore, the conventional circuit configuration of FIG. 1 has the particular disadvantage of only moderate linearity and of an unfavorable noise response. Here, the main distortions are essentially caused by the fact that the base-emitter voltage $U_{be}$ is not constant but varies as a result of a changing emitter current and the nonlinear control characteristic curve. An improvement of this condition is achieved either by controlling the arising fault voltage, as is the case in FIG. 3 with the two operational amplifiers, or by making sure that the current varies only slightly or not at all, as is shown in the pnp-npn Darlington solution in FIG. 2.

However, none of the solutions illustrated above provides a satisfactory compromise between technical implementation in terms of bandwidth, low noise, linearity and voltage requirement and the manufacturing costs to be set.

Figure 4:
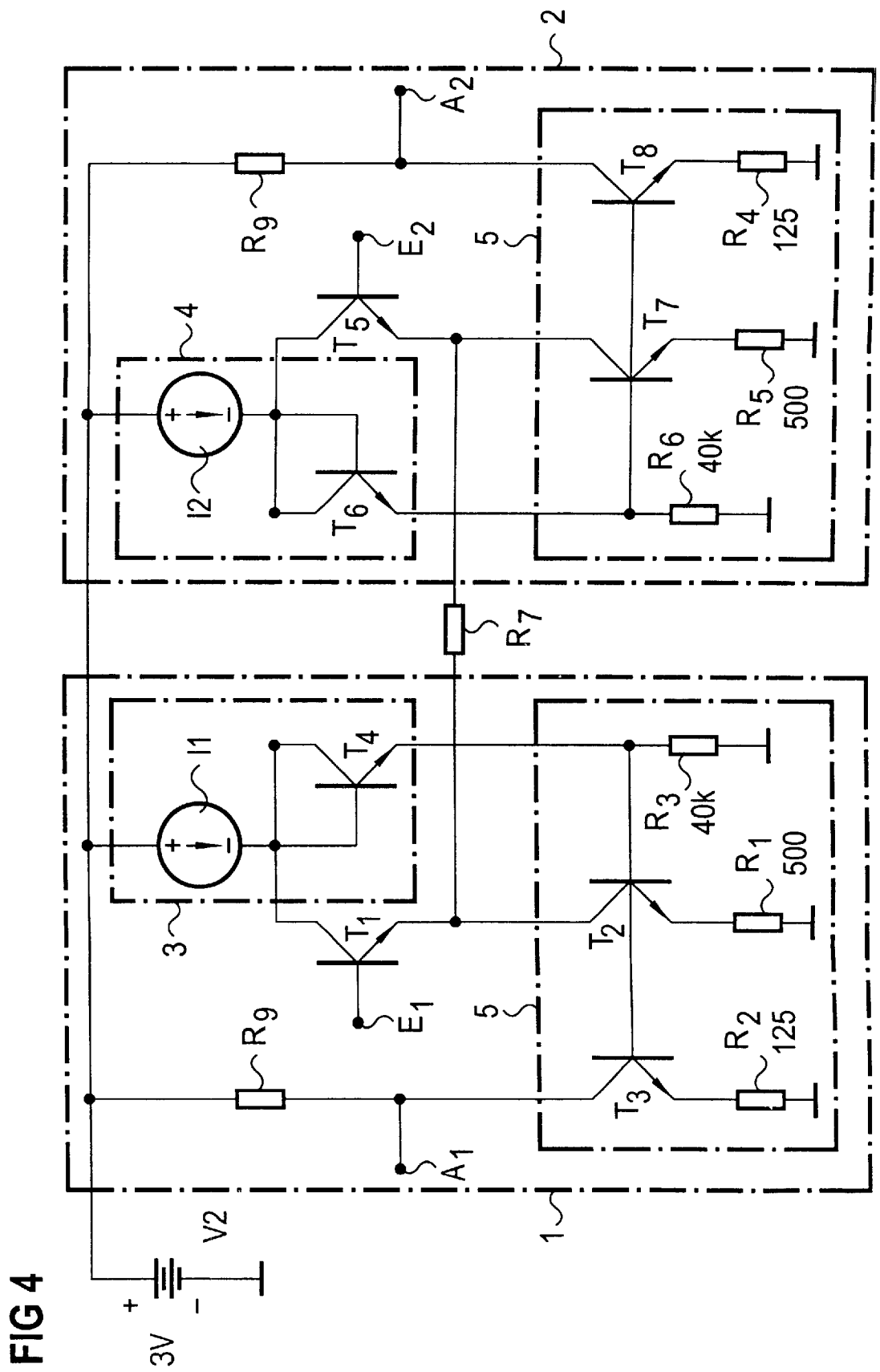
FIG. 4 is a circuit diagram of a configuration of a differential amplifier according to the invention.

FIG. 4 shows a differential amplifier according to the invention having two channels 1 and 2. The two channels 1 and 2 are configured symmetrically and have respective inputs E1, E2 and respective outputs A1, A2 and are connected to one another via a resistor R7. Each channel 1, 2 is provided with a matching block 3, 4 (surrounded by dashed lines), each of which includes a constant current source I1, I2 and a device for shifting a potential T4, T6. In addition, each channel 1, 2 has an amplifier block 5, 6, each including a respective second voltage-controlled current source T2, T7 and a respective third current source T3, T8. Both channels are supplied with an operating voltage V2, in this case three volts, through the use of a rechargeable battery or any other type of battery. The operating voltage is applied between a connection or terminal for the positive supply potential of three volts and a reference-ground potential connection. The transistors T2, T3 in channel 1 are connected to ground via resistors R1 and R2, respectively. The transistors T7, T8 in channel 2 are connected to ground via resistors R5 and R4, respectively. The resistors R1 and R5 may for example have a respective resistance of 500 Ohms. The resistors R2 and R4 may for example have a respective resistance of 125 Ohms.

In the preferred embodiment illustrated here for the circuit configuration according to the invention, the two devices for shifting a potential are embodied as transistors T4, T6 (level shifters), and the second and third current sources T2, T7 and T3, T8, respectively, are likewise realized as transistors. The controlled paths of the current sources T2, T7, T3, T8 are the collector/emitter paths of the respective transistors. Furthermore, all the transistors T1–T8 illustrated in the circuit configuration are in the form of npn transistors. This means that the differential amplifier has a sufficiently high bandwidth and is also very well suited to mass production.

The transistor T1 is connected to the positive supply potential of three volts via the current source I1. The current source I1 is connected to ground via the potential-shifting element T4 and a resistor R3. In channel 2, the current source I2 is connected to ground via the potential-shifting element T6 and a resistor R6. The resistors R3 and R6 may for example have a respective resistance of 40 kohms. The coupling node between T4 and R3 controls or drives the current source T2, whose controlled path is connected in series with the transistor T1. In addition, this node drives the current source T3, which is coupled to the output connection. The output connection is connected to the positive supply potential via a load R9. The output connection A2 of channel 2 is connected to the positive supply potential via a load R10. Channel 2 of the differential amplifier is of a correspondingly equivalent and symmetrical configuration.

The basic idea of the invention is that—with reference to channel 1—the rise of the emitter current $I_E$ is detected at the collector of the transistor T1. In this case, the current source T2 supplying the active transistor T1 reduces its current for compensation purposes, so that the total current through the active transistor T1, and hence also the base/emitter voltage $U_{be}$, remains approximately constant. The current flowing through the transistor T2 is then a portrayal of the input voltage.

This embodiment of the circuit configuration for a differential amplifier means that the differential amplifier can operate even at low operating voltages V2, and the additional current consumption is very low as compared with a simple differential amplifier. In addition, it is also possible to achieve an additional current gain by making use of an area ratio of the transistors T3 to T2 which can be set in an appropriate manner.

Figure 5:
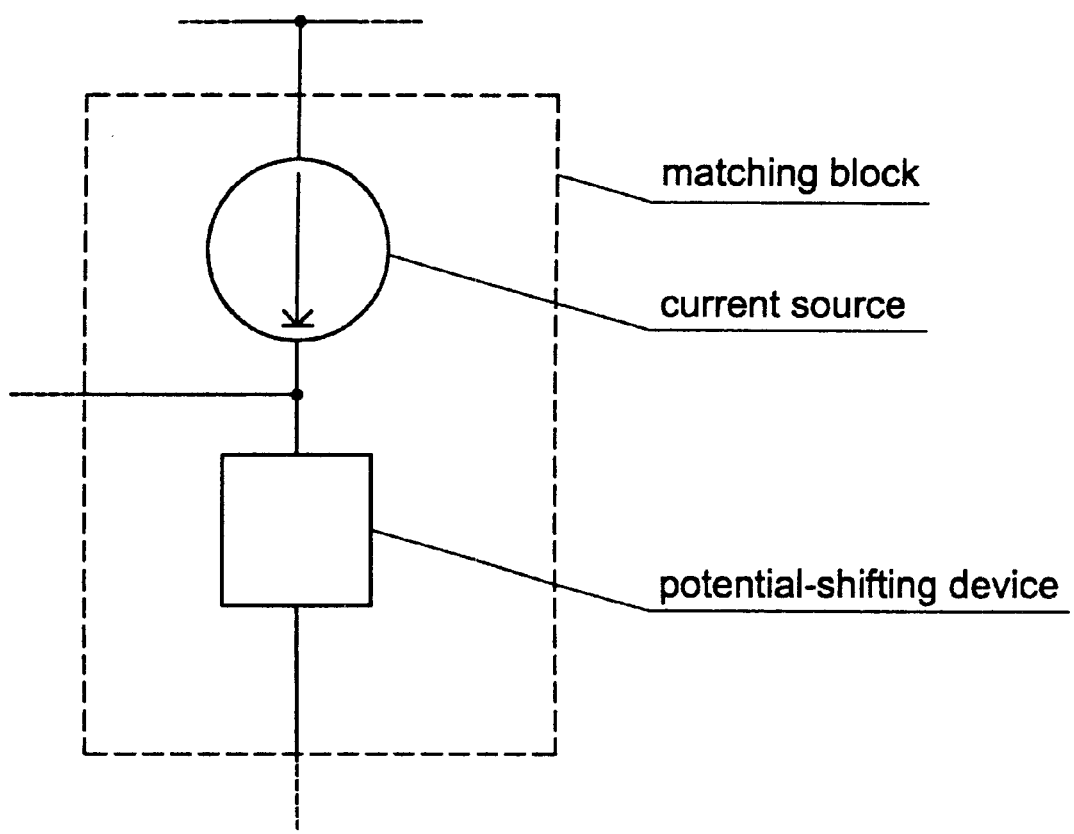
FIG. 5 is a schematic circuit diagram of a matching block.

In addition, it should also be pointed out that, in the circuit configuration shown, the transistor T4 is used merely as a potential-shifting element (level shifter) and could also be replaced by a resistor, at the expense of the loop gain. Furthermore, the resistor R3 in the circuit configuration may also be replaced by any desired current source. FIG. 5 is a schematic circuit diagram of a matching block 3, 4 to be used in the differential amplifier according to the invention. The matching block is enclosed by the dashed line shown in FIG. 5. The matching block includes a current source to be connected to the supply potential. A potential-shifting device is connected to the current source. The schematically shown potential-shifting device may be embodied as a transistor, for example, a transistor connected as a diode, as a diode, such as a Z-diode, as a resistor, or as a voltage source.

In addition, the circuit may also be constructed using pnp transistors or field-effect transistors, without departing from the scope of the invention.

The circuit configuration according to the invention thus achieves a satisfactory compromise between, on the one hand, the technical implementation in terms of bandwidth, low noise, linearity and voltage requirement and, one the other hand, the manufacturing costs which are to be expected.

Figure 6:
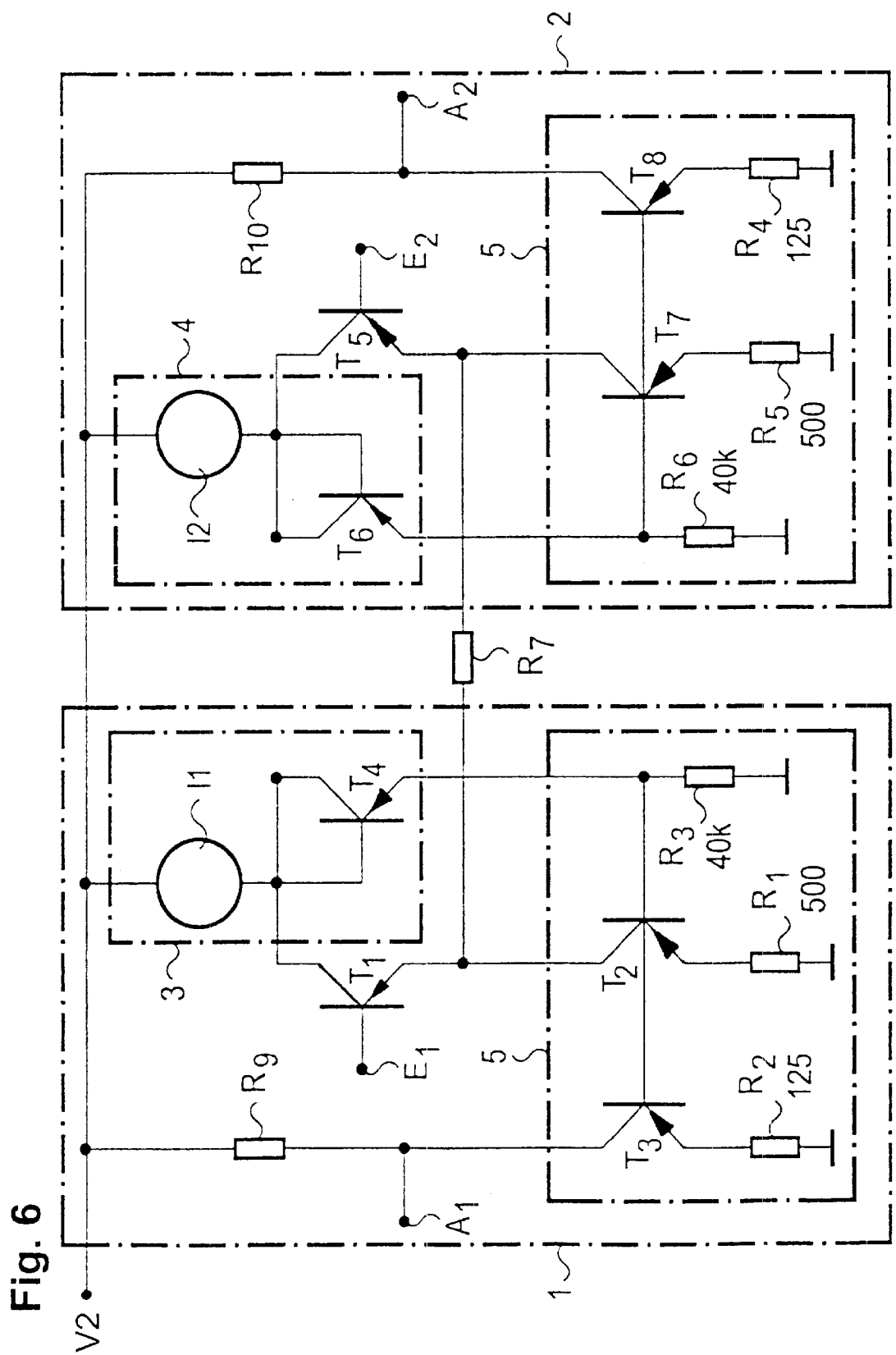
FIG. 6 is a circuit diagram of a further configuration of a differential amplifier according to the invention.

FIG. 6 is a circuit diagram of a further configuration of a differential amplifier according to the invention. The transistors T1–T8 illustrated in this circuit configuration are pnp transistors.

Figure 7:
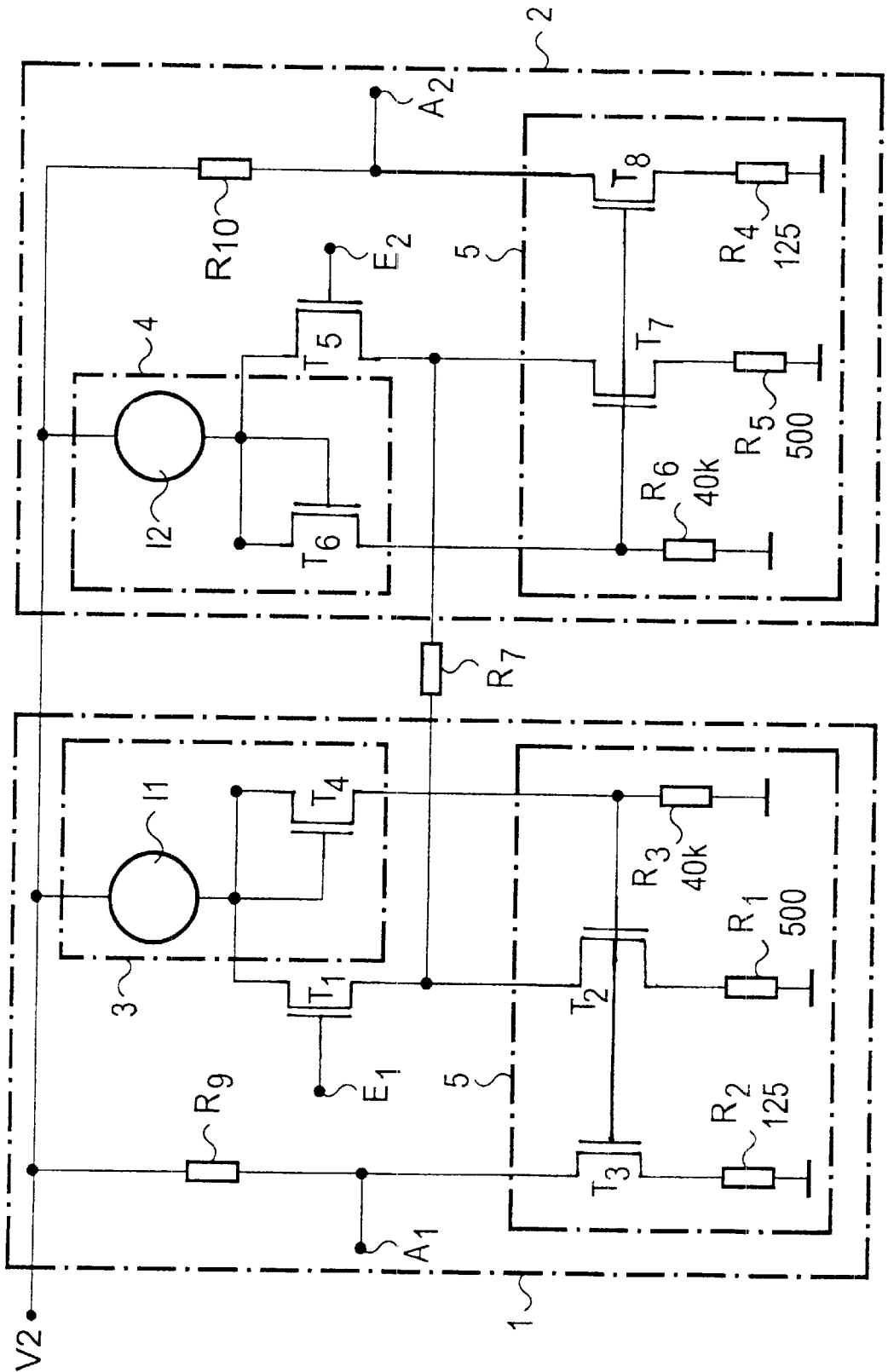
FIG. 7 is a circuit diagram of yet a further configuration of a differential amplifier according to the invention.

FIG. 7 is a circuit diagram of yet a further configuration of a differential amplifier according to the invention. The transistors T1–T8 illustrated in this circuit configuration are field effect transistors.

I claim:

1. A differential amplifier, comprising:
    a first channel and a second channel;
    each of said first and second channels having an input, an output and a terminal to be connected to a supply voltage, a transistor with a first controlled path, a first current source connected to said first controlled path, said first controlled path being connected to said terminal via said first current source, a second current source having a second controlled path connected in series with said first controlled path, said second current source being a voltage controlled current source, a third current source connected to said output, said third current source being a controlled current source, a potential-shifting device connected to said first current source, said second and third current sources being controllable via said potential-shifting device; and
    a resistor connected to said first controlled path in said first channel and to said first controlled path in said second channel for connecting said first channel to said second channel.

2. The differential amplifier according to claim 1, wherein said first current source of at least one of said first and second channels is a constant current source.

3. The differential amplifier according to claim 1, wherein said first and second channels are configured symmetrical with respect to one another.

4. The differential amplifier according to claim 1, wherein said potential-shifting device of at least one of said first and second channels is a diode.

5. The differential amplifier according to claim 1, wherein said transistor is a first transistor and said potential-shifting device of at least one of said first and second channels is a second transistor connected as a diode.

6. The differential amplifier according to claim 1, wherein said potential-shifting device of at least one of said first and second channels is an electrical component selected from the group consisting of a resistor, a voltage source and a Z-diode.

7. The differential amplifier according to claim 1, wherein said second current source of at least one of said first and second channels is a further transistor.

8. The differential amplifier according to claim 1, wherein said second current source operates as a linearization device.

9. The differential amplifier according to claim 1, wherein said transistor is a first transistor, said second current source includes a second transistor operating as a linearization device.

10. The differential amplifier according to claim 1, wherein said transistor is a first transistor, said second current source includes a second transistor operating as a linearization device, said third current source includes a third transistor, said second and third transistors have respective bases connected to one another.

11. The differential amplifier according to claim 1, wherein said transistor is one of an npn transistor and a pnp transistor.

12. The differential amplifier according to claim 1, wherein said transistor is a first transistor, said second current source includes a second transistor, at least one of said first and second transistors is an npn transistor.

13. The differential amplifier according to claim 1, wherein said transistor is a first transistor, said second current source includes a second transistor, said third current source includes a third transistor, at least one of said first, second and third transistors is an npn transistor.

14. The differential amplifier according to claim 1, wherein said transistor is a first transistor, said second current source includes a second transistor, at least one of said first and second transistors is a pnp transistor.

15. The differential amplifier according to claim 1, wherein said transistor is a first transistor, said second current source includes a second transistor, said third current source includes a third transistor, at least one of said first, second and third transistors is a pnp transistor.

16. The differential amplifier according to claim 1, wherein said transistor is a field effect transistor.

17. The differential amplifier according to claim 1, wherein said transistor is a first transistor, said second current source includes a second transistor, at least one of said first and second transistors is a field effect transistor.

18. The differential amplifier according to claim 1, wherein said transistor is a first transistor, said second current source includes a second transistor, said third current source includes a third transistor, at least one of said first, second and third transistors is a field effect transistor.

19. The differential amplifier according to claim 1, wherein said transistor is a first transistor, said second current source includes a second transistor, said third current source includes a third transistor, said first, second and third transistors being a same type of transistor in both of said first and second channels.

* * * * *